US007521634B2

(12) United States Patent
Clem et al.

(10) Patent No.: US 7,521,634 B2
(45) Date of Patent: Apr. 21, 2009

(54) MULTI-CHANNEL SIGNAL ACQUISITION PROBE (75) Inventors: Jonathan D. Clem, Hillsboro, OR (US); Daniel B. Meyer, Lake Oswego, OR (US)

(73) Assignee: Tektronix, Inc., Beaverton, OR (US)

( * ) Notice: Subject to any disclaimer, the term of this patent is extended or adjusted under 35 U.S.C. 154(b) by 296 days.

(21) Appl. No.: 11/437,584

(22) Filed: May 19, 2006

(65) Prior Publication Data

US 2007/0267213 A1     Nov. 22, 2007

(51) Int. Cl.
*H01B 7/00* (2006.01)
(52) U.S. Cl. ............... 174/113 R; 174/71 R; 174/71 C; 174/72 R; 174/72 A; 174/72 TR
(58) Field of Classification Search .............. 174/102 R, 174/36, 102 C, 103, 105, 109, 110 R, 113 R, 174/70 R, 71 R, 72 R, 72 A, 72 TR
See application file for complete search history.

(56) References Cited

U.S. PATENT DOCUMENTS

| | | | | |
|---|---|---|---|---|
| 4,353,372 A * | 10/1982 | Ayer | ........................... | 600/393 |
| 5,223,787 A | 6/1993 | Smith | | |
| 5,543,831 A * | 8/1996 | Tsuji et al. | ..................... | 348/65 |
| 5,546,950 A * | 8/1996 | Schoeckert et al. | ......... | 600/508 |
| 5,720,718 A * | 2/1998 | Rosen et al. | .................. | 604/22 |
| 5,895,298 A * | 4/1999 | Faupel et al. | ................ | 439/729 |
| 5,937,950 A * | 8/1999 | Adams et al. | ............. | 174/72 R |
| 6,178,354 B1 * | 1/2001 | Gibson | ........................ | 607/116 |
| 6,870,109 B1 * | 3/2005 | Villarreal | ................ | 174/102 R |
| D519,084 S * | 4/2006 | Hertel et al. | ................ | D13/154 |
| D519,085 S * | 4/2006 | Gull et al. | ................... | D13/155 |
| 2003/0107389 A1 * | 6/2003 | Lyford | ........................ | 324/754 |
| 2003/0193341 A1 * | 10/2003 | McTigue | .................... | 324/754 |
| 2005/0162147 A1 * | 7/2005 | Cannon | ..................... | 324/72.5 |
| 2006/0241467 A1 * | 10/2006 | Takeda et al. | ............... | 600/459 |

\* cited by examiner

*Primary Examiner*—William H Mayo, III
(74) *Attorney, Agent, or Firm*—William K. Bucher (57) ABSTRACT A multi-channel signal acquisition probe has a ribbon cable with ganged coaxial signal cables. The coaxial signal cables are separated into individual cables at one end of the ribbon cable. A junction box is mounted the ribbon cable with the individual cables extending through apertures in a front face of the junction box. An electrically conductive terminal is disposed in the junction box and extends into openings in opposing sides of the junction box. The electrically conductive terminal is electrically coupled to each outer shielding conductor of the signal cables. The free ends of each of the individual signal cables has a probing head. A terminal connector is disposed on the other end of the ribbon cable.

20 Claims, 7 Drawing Sheets

MULTI-CHANNEL SIGNAL ACQUISITION PROBE

BACKGROUND OF THE INVENTION

The present invention related generally to signal acquisition probes and more particularly to a multi-channel signal acquisition probe usable for acquiring logic signal from a device under test.

Multi-channel signal acquisition probes are generally used to acquire multiple signals from a device under test. A multi-channel general purpose probe has a single connector one end that couples to a measurement test instrument, such as a logic analyzer, mixed signal oscilloscope or the like. The other end of the multi-channel general purpose probe has individual cables with electrical connectors disposed in housings at the ends of the cables for connecting to separate location on the device under test. High performance multi-channel general purpose probes have a controlled electrical environment the length of the probe that is generally achieved using coaxial signal cables.

Most high performance multi-channel general purpose probes available today have inherent construction expenses and related performance issues. In one design, the high performance multi-channel probe has a ribbon cable having individual coaxial cable ganged together. One end of the ribbon cable is coupled to a connector that interfaces with the measurement test instrument. The other end of the ribbon cable is attaches to a midpoint board. The central signal conductor and outer shielding conductor of each coaxial signal cable is soldered to connections of the midpoint board. Individual coaxial signal lines are also soldered to the midpoint board to breakout the individual coaxial signal lines for connecting to the device under test. The midpoint board may also include a signal ground line that is common to all of the coaxial signal cables to allow a user to connect to a reference ground close to the device under test. The individual coaxial signal cables are electrically coupled to electrical circuitry in the housing at the ends of the cables A disadvantage of the above design is that there are multiple discontinuities in the signal path due to the soldering of the coaxial signal cables of the ribbon cable and the individual coaxial signal cables to the midpoint board and the soldering of the coaxial signal cable and the ribbon cable to connections at the ends of the cables. Coaxial cables are difficult and labor intensive to attach to a board because there are inner and outer conductors with insulating material in between that need to prepared and connected without shorting the inner and outer conductors together. Attaching ribbonized coaxial signal cables to the board is even more complex and expensive.

Another approach to high performance general purpose probes available in the market has unbroken, individual coaxial cables running from the measurement test instrument connector to the individual channel connectors. This has the advantage of reducing the number of interconnect related impedance discontinuities between the probe input and output. The assembly of the individual probes is easier and the electrical performance is better since there are two coaxial cable lands per cable. However, this design has the disadvantage of longer individual coaxial cables that are difficult to manage and keep from being tangled, caught or damaged in normal use. Existing products using this approach deal with this disadvantage by enclosing the portions of the coaxial signal cables that are normally ganged or grouped together in a loosely fitting sleeve to keep the cables from wandering. However, the sleeve represents extra material and labor expense that diminishes the savings in the electrical assembly. This approach also has the disadvantage in that there is no place to connect a signal ground common to all of the channels unless it is all the way back at the connection with the measurement test instrument which is relatively far from the device under test. The P6417 General Purpose Probe, manufactured and sold by Tektronix, Inc., Beaverton, Oreg., is an example of a high performance multi-channel general purpose probe using this approach.

U.S. Pat. No. 5,223,787 describes a high-speed, low-profile test probe for use in acquiring signals from a device under test. The test probe has a substrate with electrical circuitry thereon and is overmolded with insulating material. A socket connector is electrically coupled to the substrate for connecting to test pins on a device under test. Signal and ground wires are electrically coupled to the substrate for providing electrical ground to the substrate and coupling a signal under test to a measurement test instrument. A notch is formed in the insulating material to expose a ground connection on the substrate. A ground lead may be coupled to the ground connection exposed in the notch. The patent also describes a probe holder for ganging multiple test probes together for multi-channel probing. The probe holder has an electrically conductive clip that electrically couples the exposed ground connections of the individual probes together for the shortest possible ground connections between the ground pins on the device under test and the ground connections of the probes.

The high-speed, low profile probe uses individual signal and ground lines which have poorly controlled signal paths as compared to high performance multi-channel general purpose probes. Further, the probe holder with the electrically conductive ground clip only works when the probes are ganged together in the holder. For applications where the probes are distributed on probing points across the device under test, this solution does not work.

What is needed is a high performance multi-channel general purpose signal acquisition probe that overcomes the limitations of the current high performance general purpose probe designs. The high performance multi-channel general purpose signal acquisition probe should limit the number of signal discontinuities by reducing the number of solder connections of the coaxial signal probes. Further, the high performance multi-channel general purpose signal acquisition probe should provide a common signal ground for all of the coaxial signal probes that is substantially closer than the measurement test instrument.

SUMMARY OF THE INVENTION

The above needs are met with a multi-channel signal acquisition probe having a ribbon cable with a plurality of coaxial signal cables ganged together in a ribbon cable with the ganged coaxial signal cables being separated into individual signal cables at one end of the ribbon cable. Each coaxial cable has a central signal conductor and a surrounding shielding conductor separated by an insulating layer. A junction box is disposed on the ribbon cable where the coaxial signal cables separate into individual signal cables with the junction box having apertures disposed in a front face through which extend the individual coaxial signal cables. The junction box also has openings on opposing sides of the junction box in which an electrically conductive terminal extends. The electrically conductive terminal is electrically coupled to each of the outer shielding conductors of the coaxial signal cables. The free ends of each of the individual coaxial signal cables have probing heads disposed thereon with each probing head having electrical circuitry electrically coupled to the central signal conductor and the outer shielding conductor of each coaxial signal cable. A terminal connector is disposed on the other end of the ribbon cable having electrically conductive contacts. Each of the electrically conductive contacts is electrically coupled to one of the central signal conductors of the coaxial signal cables. At least one electrically conductive contacts is coupled to the surrounding shielding conductors of the coaxial signal cables.

The apertures in the junction box are preferably evenly spaced on an arcuate front face of the junction box with each aperture having an outward bevel. The junction box preferably has first and second housing members with at least one of the first and second housing members has upwardly extending studs disposed adjacent to the opening on the opposing sides of the junction box. The electrically conductive terminal is positioned in the junction box on the upwardly extending studs with the upwardly extending studs being received in apertures formed in the electrically conductive terminal.

Each of the probing heads has a substrate with the electrical circuitry disposed thereon. Each of the substrates is disposed in a cavity formed in a housing. The cavity is exposed at one end of the housing for receiving the substrate. The other end of the housing has two bores formed therein that intersect the cavity. An end cap positioned on the coaxial signal probe is positioned in cavity of the housing for securing the substrate in the cavity of the housing. Electrically conductive contacts are disposed in the bores in the housing and are electrically coupled to the electrical circuitry on the substrate.

The probing head housing is preferably formed with offset portions where one portion axially extending a greater distance than the other portion. Each of the housing portions has one of the bores extending therein. The substrate also has offset portions with one portion axially extending a greater distance than the other portion. Each extending portion of the substrate has an end face with an electrically conductive contact disposed thereon. The electrically conductive contact disposed on the end face of the substrate portion extending a greater distance is electrically coupled to the central signal conductor of the coaxial signal probe via the electrical circuitry, such as a resistive element. The electrically conductive contact disposed on the end face of the other substrate portion is electrically coupled to the outer shielding conductor of the coaxial signal cable. Each of the electrically conductive contacts in the probe housing has a compressible electrically conductive contact electrically coupled to the electrically conductive contact on the end face of the substrate and an electrically conductive socket closely received in the respective bores and electrically coupled to the compressible electrically conductive contact. In the preferred embodiment, the compressible electrically conductive contacts are electrically conductive elastomer.

The terminal connector preferably has a substrate with the electrically conductive contacts formed thereon. Each of the central signal conductors and the outer shielding conductors of the coaxial signal probes are electrically coupled to the substrate. The substrate is disposed in a housing having a spring latch with movable latching prongs extending from either side of the housing.

The multi-channel signal acquisition probe is preferably implemented with multiple ribbon cables with each of the ribbon cables having the separated coaxial signal cables at one end a junction box disposed on the ribbon cables where the coaxial signal cables separate into individual signal cables. Each of the junctions boxes has an electrically conductive terminal disposed therein and extending to the opening on either side of the junction box. Each electrically conductive terminal is coupled to each of the outer shielding conductors of the coaxial signal cables of the respective ribbon cables. The free ends of each of the individual coaxial signal cables has a probing head connected thereon with the electrical circuitry in the probing head electrically coupled to the central signal conductor and the outer shielding conductor of each coaxial signal cable. The multiple ribbon cables are terminated in the terminal connector where the electrically conductive contacts of the terminal connector are coupled to each of the central signal conductors of the coaxial signal cables and at least one of the electrically conductive contacts is coupled to the surrounding shielding conductors of the coaxial signal cables.

The objects, advantages and novel features of the present invention are apparent from the following detailed description when read in conjunction with appended claims and attached drawings.

DETAILED DESCRIPTION OF THE INVENTION

Figure 1:
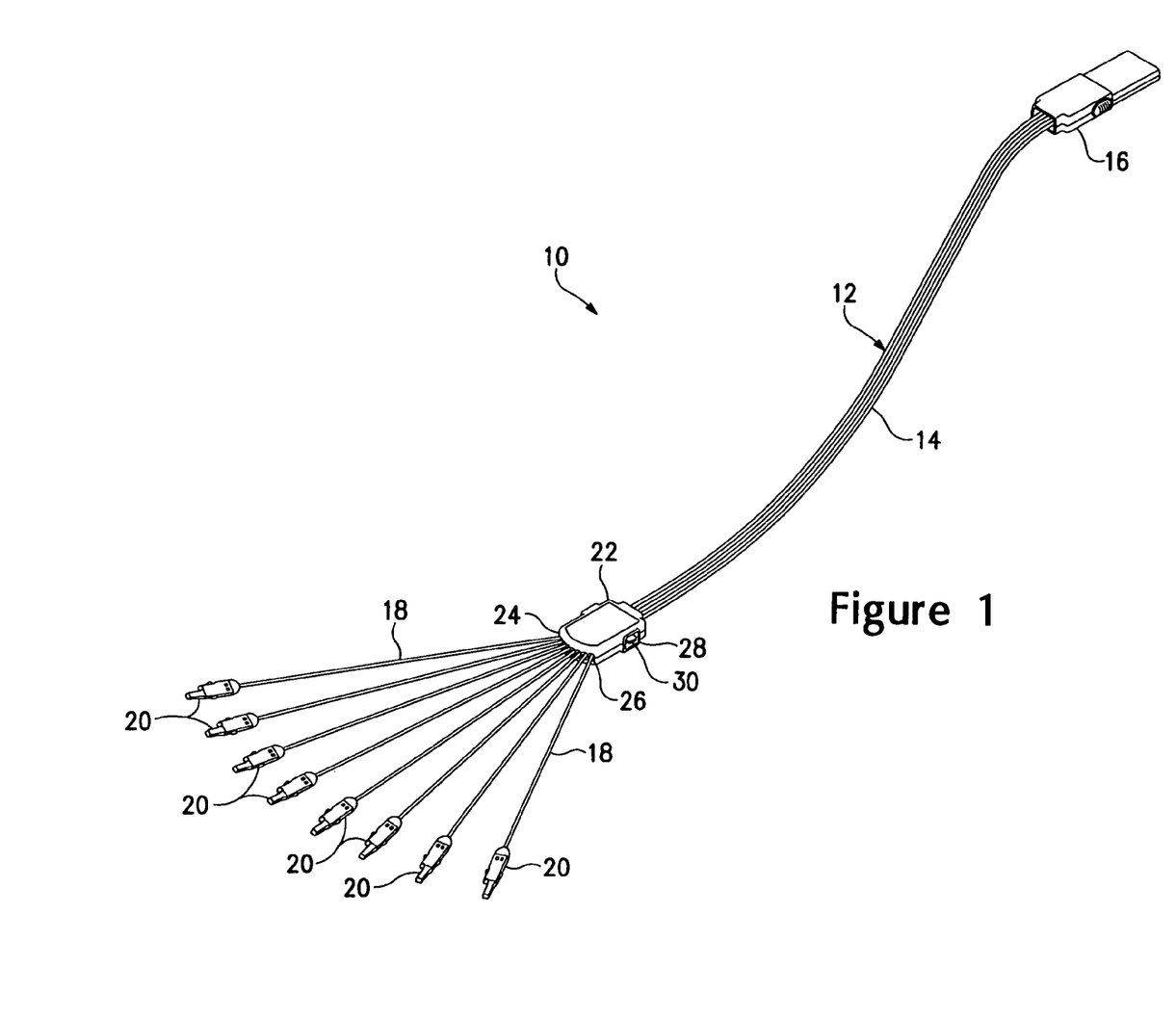
FIG. 1 is a perspective view of the multi-channel signal acquisition probe.

Referring to FIG. 1, there is shown a perspective view of the multi-channel signal acquisition probe 10. The multi-channel signal acquisition probe 10 has a ribbon cable 12 having ganged coaxial signal cables 14. One end of the ribbon cable 12 is connected to a terminal connector 16 for connecting the multi-channel signal acquisition probe 10 to a measurement test instrument, such as a mixed signal oscilloscope, logic analyzer or the like (not shown). The coaxial signal cables 14 at the other end of the ribbon cable 12 are separated into individual coaxial signal cables 18. Each of the individual coaxial signal cables 18 has a probing head 20 for connecting to a device under test (not shown). A junction box 22 is mounted on the ribbon cable 12 where the ganged coaxial signal cables 14 are separated into the individual coaxial signal cables 18. The junction box 22 has a front face 24 with apertures 26 therein from which extend the individual coaxial signal cables 18. Openings 28 are formed on opposing sides of the junction box 22 for exposing portions of an electrically conductive terminal 30 disposed in the junction box 22.

Figure 2:
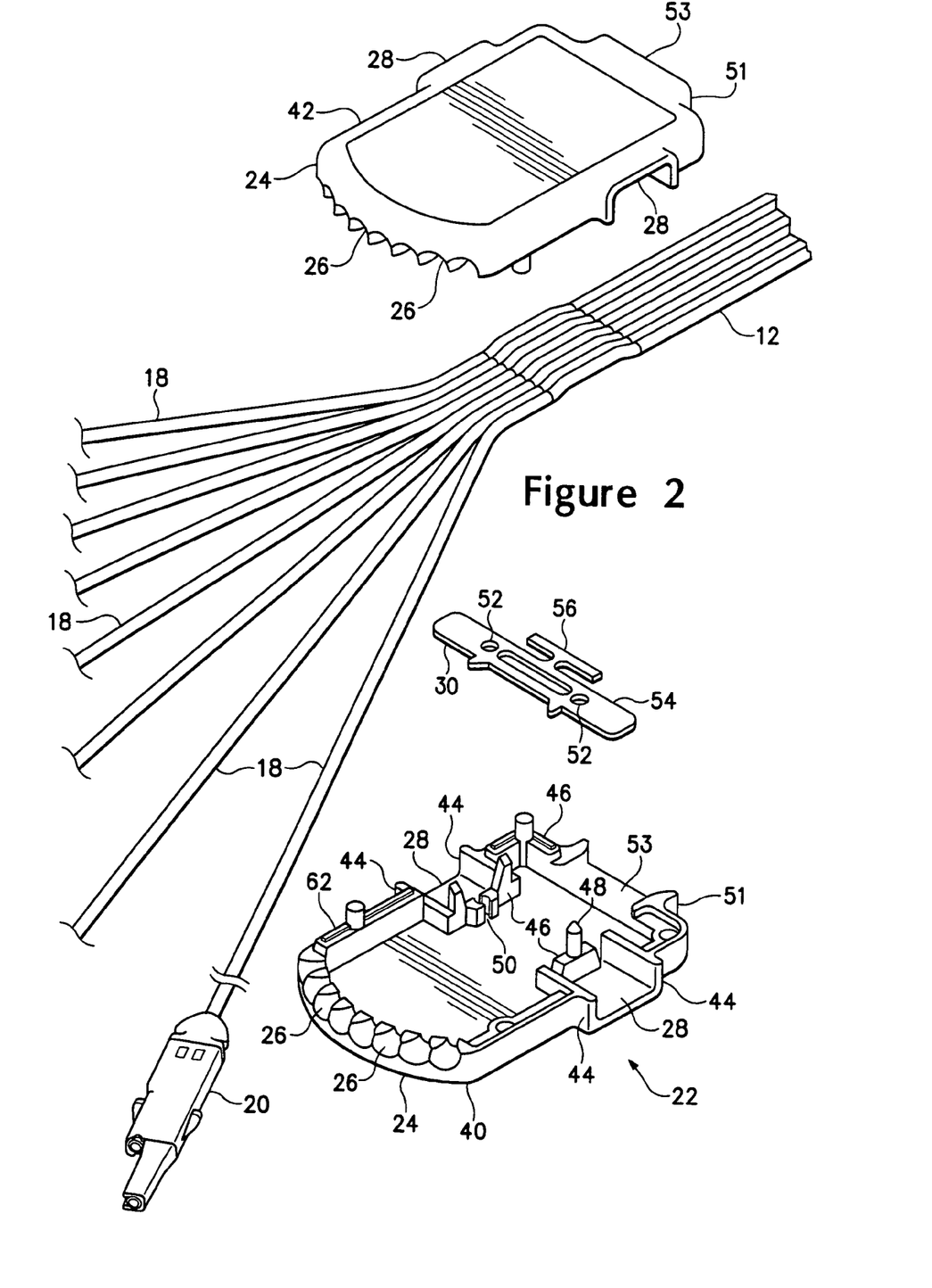
FIG. 2 is a exploded perspective view of the junction box at the front portion of the multi-channel signal acquisition probe.

Referring to FIG. 2, there is shown an exploded perspective view of the junction box 22. Like elements from the previous drawing are labeled the same in FIG. 2. The junction box 22 is preferably formed of first and second housing members 40 and 42. Each housing member 40 and 42 are substantially identical in construction. The housing members are preferably made of an insulating material, such as ABS plastic or the like. The front face 24 of each of the housing member 40 and 42 is preferably arcuate in form with the apertures 26 evenly spaced along the arcuate front face 24. Each aperture 26 is beveled outward to reduce sharp edges on the apertures 26. The front face 24 of the junction box 22 is not limited to an arcuate front face 24 and other front face forms may be implemented for the junction box 22 without departing from the scope of the present invention. Each housing member 40 and 42 has sidewalls 44 extending inward from each of the openings 28 that intersects an end wall 46. One of the end walls 46 has a stud 48 extending upward therefrom and the other end wall has an aperture 50 formed therein. The electrically conductive terminal 30 is positioned in the junction box 22 with the studs 48 pass through apertures 52 formed in the electrically conductive terminal 30 and engaging the apertures 50 in the end walls 46. The rear face 51 of each of the housing members 40 and 42 has an aperture 53 formed therein for receiving the ribbon cable 12.

The electrically conductive terminal 30 is preferably formed of a brass or other electrically conductive material plated with a layer of nickel. The electrically conductive terminal 30 has a main portion 54 having a lateral dimension sufficient to extend to the edges of the openings 28 in the opposing sides of the junction box 22. A tab 56 extends from and is centrally disposed on the main portion 54 to aid in electrically connecting the electrically conductive terminal 30 to outer shielding conductors of the coaxial signal cables 14.

Figure 3:
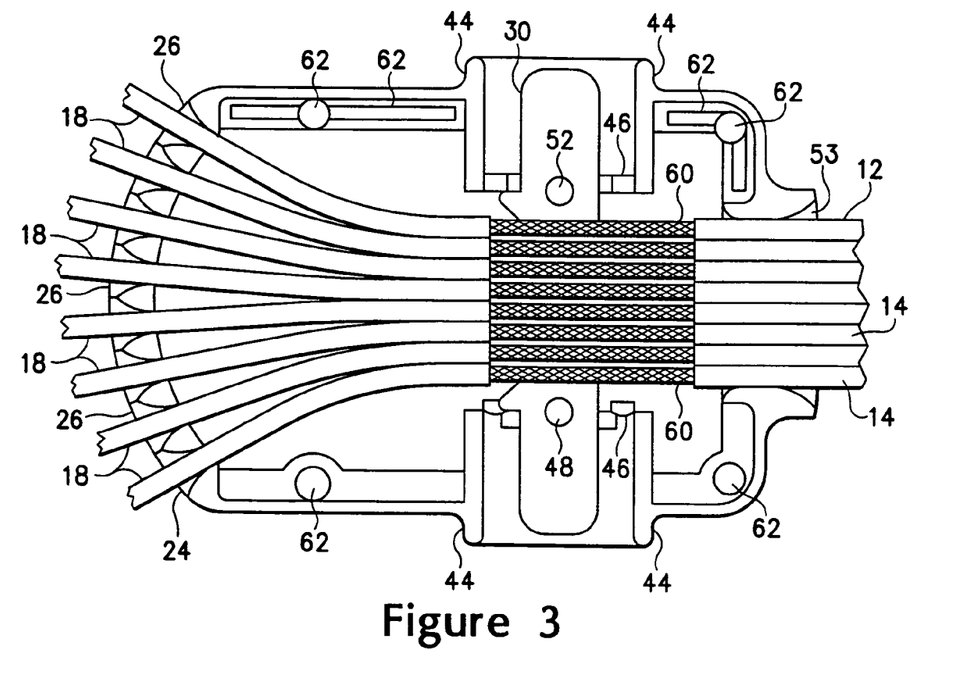
FIG. 3 is an plan view of interior layout of the junction box of the multi-channel signal acquisition probe.

FIG. 3 is a plan view of the interior layout of the junction box 22. The junction box 22 is mounted on the ribbon cable 12 where the coaxial signal cables 14 are divided into individual coaxial signal cables 18. A portion of the outer insulating layer of the ribbon cable 12 is removed to exposed the outer shielding conductors 60 of the coaxial signal cables 14. The electrically conductive terminal 30 is positioned on the exposed outer shielding conductors 60 and electrically coupled to each of the outer shielding conductors 60. The electrical connections are preferably made by soldering the tab 56 of the electrically conductive terminal 30 to the outer shielding conductor 60. Alternately, the electrically conductive terminal 30 may be electrically coupled to the outer shielding conductors 60 using an electrically conductive adhesive, such as electrically conductive epoxy. The electrically conductive terminal 30 may also be electrically coupled to the outer shielding conductors 60 using a compression mechanism, such as a spring or the like, positioned in the junction box 22. The electrically conductive terminal 30 is positioned in the junction box 22 with the ends of the main portion 54 extending into the openings 28. The apertures 52 of the electrically conductive terminal 30 are positioned on the upwardly extending stud 48 and over the aperture 50 in the end walls 46 of the junction box housing member 40. The individual coaxial signal cables 18 are positioned through the apertures 26 in the front face 24 of housing member 40 with the ribbon cable extending from aperture 53. The other housing member 42 is positioned on the first housing member 40 with the stud 48 of the first housing member 40 engaging the aperture 50 in the second housing member 42 and the stud 48 in the second housing member 42 engaging the aperture 50 in the first housing member 40. Studs, apertures, ribs and slots 62 may be formed on periphery of the housing members 40, 42 to align the two housing members together. The housing members 40 and 42 may be secured together using an adhesive, such as epoxy or the like, sonic welding, or other well known methods of securing two parts together.

Figure 4:
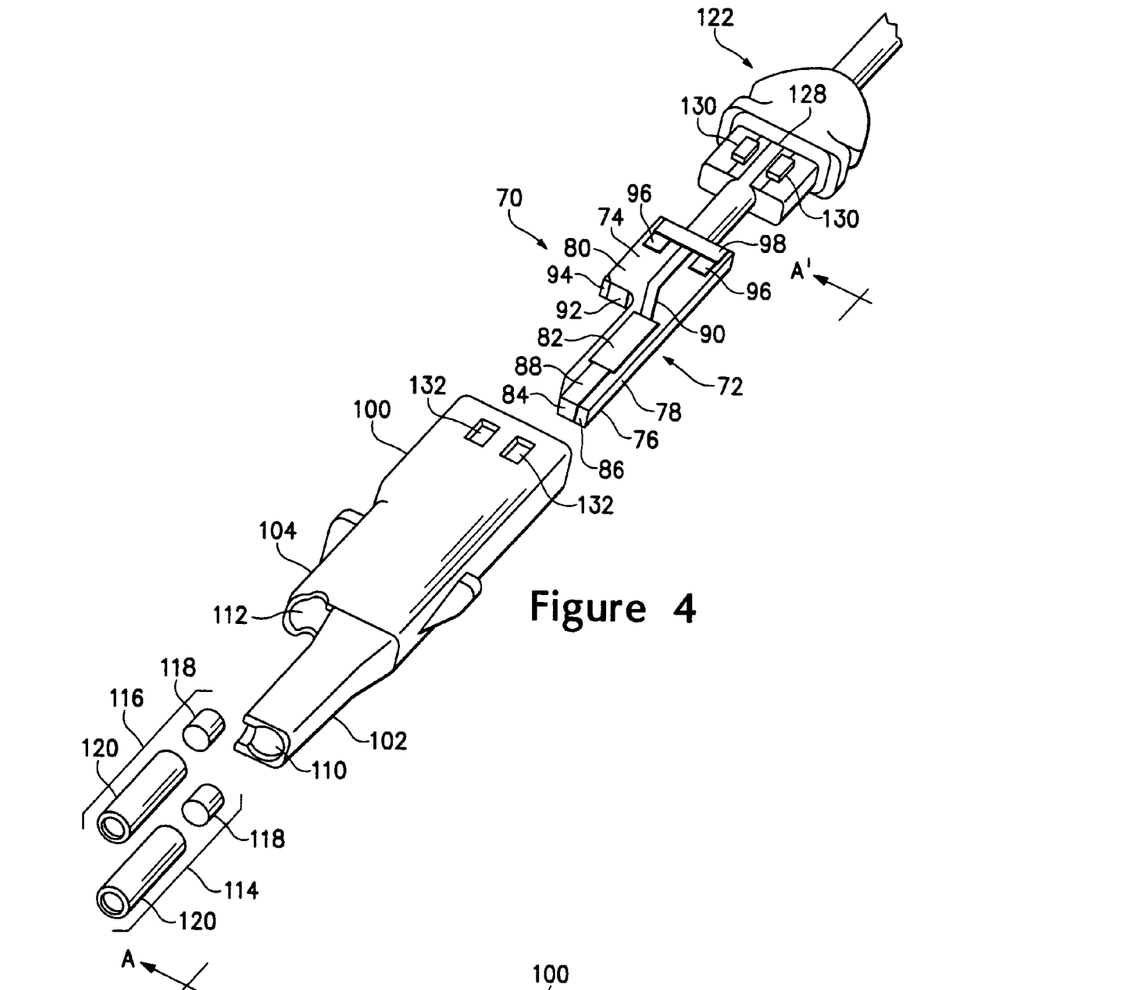
FIG. 4 is an exploded perspective view of one of the probing heads of the multi-channel signal acquisition probe.

FIG. 4 is an exploded perspective view of the probing head 20 attached to the free ends of the coaxial signal cables 18. Like elements from the previous drawings are labeled the same in FIG. 4. The probing head 20 has a substrate 70 having electrically conductive circuitry formed 72 thereon. The substrate 70 is preferably formed of a circuit board material, such as FR4. The substrate 70 has top and bottom surfaces 74 and 76 and offset portions 78 and 80. The first portion 78 axially extends a greater distance than the second portion 80. The electrical circuitry 72 includes a resistive element 82 formed on the top surface 74 of the substrate and electrically coupled to an electrically conductive contact 84 formed on an end face 86 of the first offset portion 76 via a conductive trace 88. The resistive element 82 is also electrically coupled to the central signal conductor of the coaxial signal conductor vias circuit trace 90. The bottom surface 76 of the substrate 70 has an electrically conductive ground plane that is electrically coupled to a second electrically conductive contact 92 formed on an end face 94 of the second portion 80 of the substrate 70. The ground plane extends onto the rear end face of the substrate 70 and the top surface 74 of the substrate 70 to form electrically conductive contact pads 96 on the top surface 72. The outer shielding conductor 60 of the coaxial signal cable 18 extends outward along the rear end face of the substrate 70 and is in electrical contact with the ground plane on the rear end face of the substrate 70. A substrate solder bar 98 is placed on the substrate 70 to capture the outer shielding conductor 60 between the solder bar 98 and the electrically conductive solder pads 96 on the top surface 74 of the substrate 70.

A housing 100 preferably formed of an insulating material, such a ABS plastic or the like receives the substrate 70. The housing 100 has offset portions 102 and 104 having a similar configuration to the substrate 70 with one of the offset portions 102 axially extending a greater distance than the other portion 104. The housing 100 has a cavity 106 formed therein, as best shown in the cross-section view of the housing 100 along line A-A' in FIG. 5, with the cavity 106 exposed at the distal end 108 of the housing for accepting the substrate 70. The housing 100 has first and second bores 110 and 112 disposed in the offset portions 102 and 104 of the housing 100 and extending into housing 100 to intersect with the cavity 106. Each bore 110 and 112 receives an electrically conductive contact 114 and 116 having a compressible electrically conductive contact 118 and a socket 120. The compressible electrically conductive contact 118 is preferably an electrically conductive elastomer but other type of compressible electrically conductive contacts, such as electrically conductive fuss buttons, electrically conductive springs and the like may be used. A movable cable retention housing end cap 122 is positioned on the coaxial signal cable 18. A bore 128 is formed in the end cap 122 with the coaxial signal cable 18 passing through the bore 128 prior to securing the coaxial signal cable 18 to the substrate 70.

Figure 5:
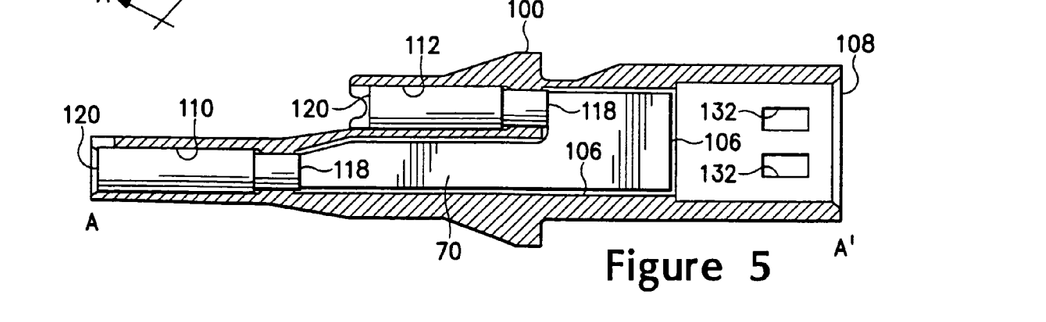
FIG. 5 is a cross sectional view along line A-A' of the probing heads of the multi-channel signal acquisition probe.

Each probing head 20 is assembled by inserting the coaxial signal cable 18 through the bore 128 in the end cap 122 and electrically coupling the signal conductor and the outer shielding conductor 60 of the coaxial signal cable 18 to the electrically conductive circuitry 72 on the substrate 70. The substrate 70 is inserted into the cavity 106 with the end cap 122 being inserted into the rear portion of the cavity 106 to secure the substrate 70 in the housing 100. Tabs 130 on the end cap 122 engage slots 132 formed in the housing 100 to secure the end cap 122 to the housing 100. The compressible electrically conductive contacts 118 are inserted in each of the bores 110 and 112 of the housing 100 and the sockets 120 are press fit into the bores 110 and 112.

Figure 6:
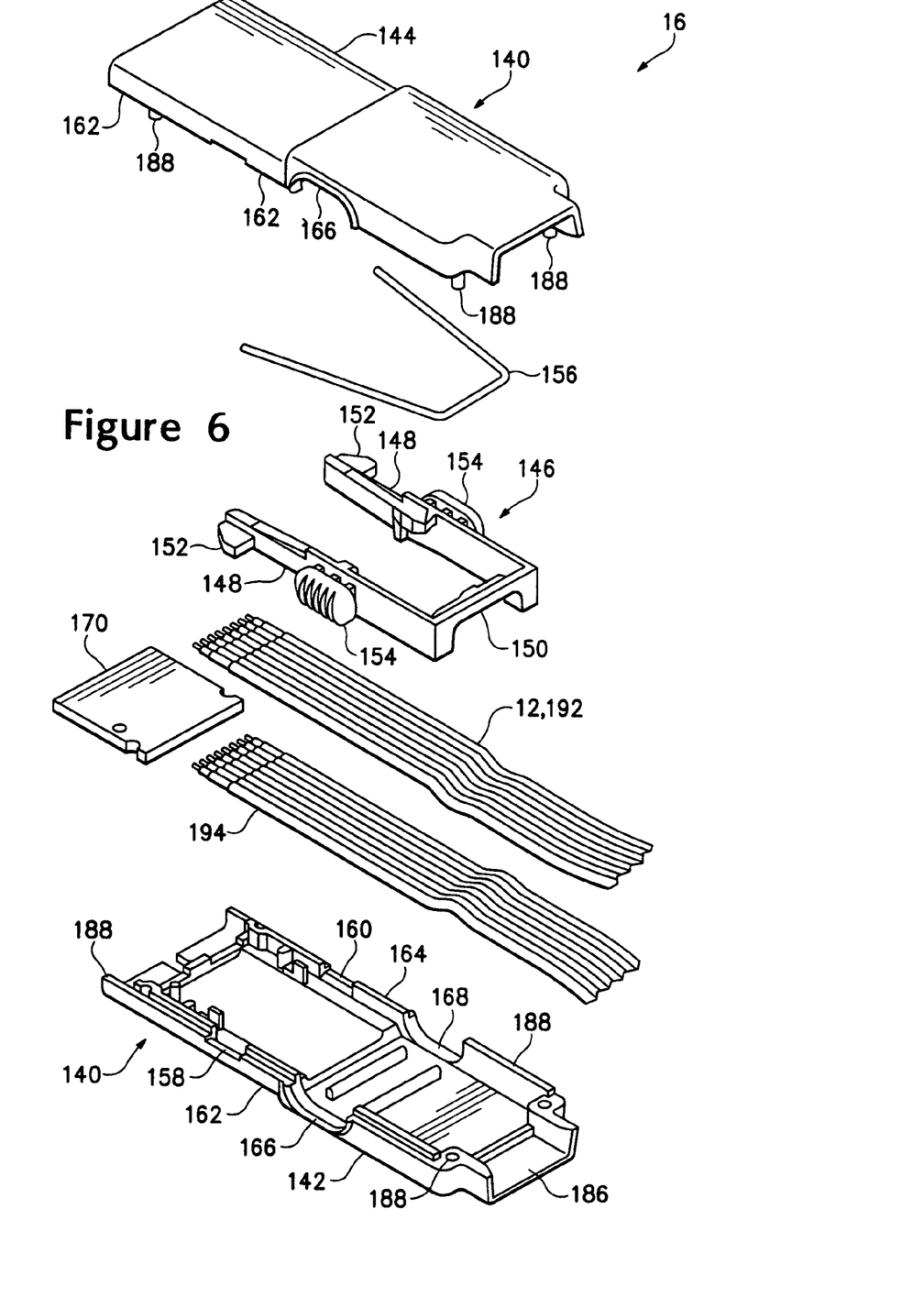
FIG. 6 is an exploded perspective view of the terminal connector of the multi-channel signal acquisition probe.

Referring to FIG. 6, there is shown an exploded perspective view of the terminal connector 16. The terminal connector 16 includes a housing 140 having first and second housing members 142 and 144. The housing members 142 and 144 are preferably formed of an insulating material, such as ABS plastic or the like. Disposed within the housing 140 is a "U" shaped latch 146 having arms 148 extending from opposing ends of a base 150. Outwardly extending prongs 152 are formed at the free ends of the arms 148 and outwardly extending knobs 154 are formed partway along the arms 148. A spring member 156 is place in compression and positioned along the inner surfaces of the arms 148 and the base 150. The housing members 142 and 144 have apertures 158 and 160 formed in the opposing side surfaces 162 and 164 for receiving the outwardly extending prongs 152 of the spring latch 146. A second set of apertures 166 and 168 are formed in the opposing sides of the housing members 142 and 144 for receiving the knobs 154 of the spring latch 146.

Figure 7:
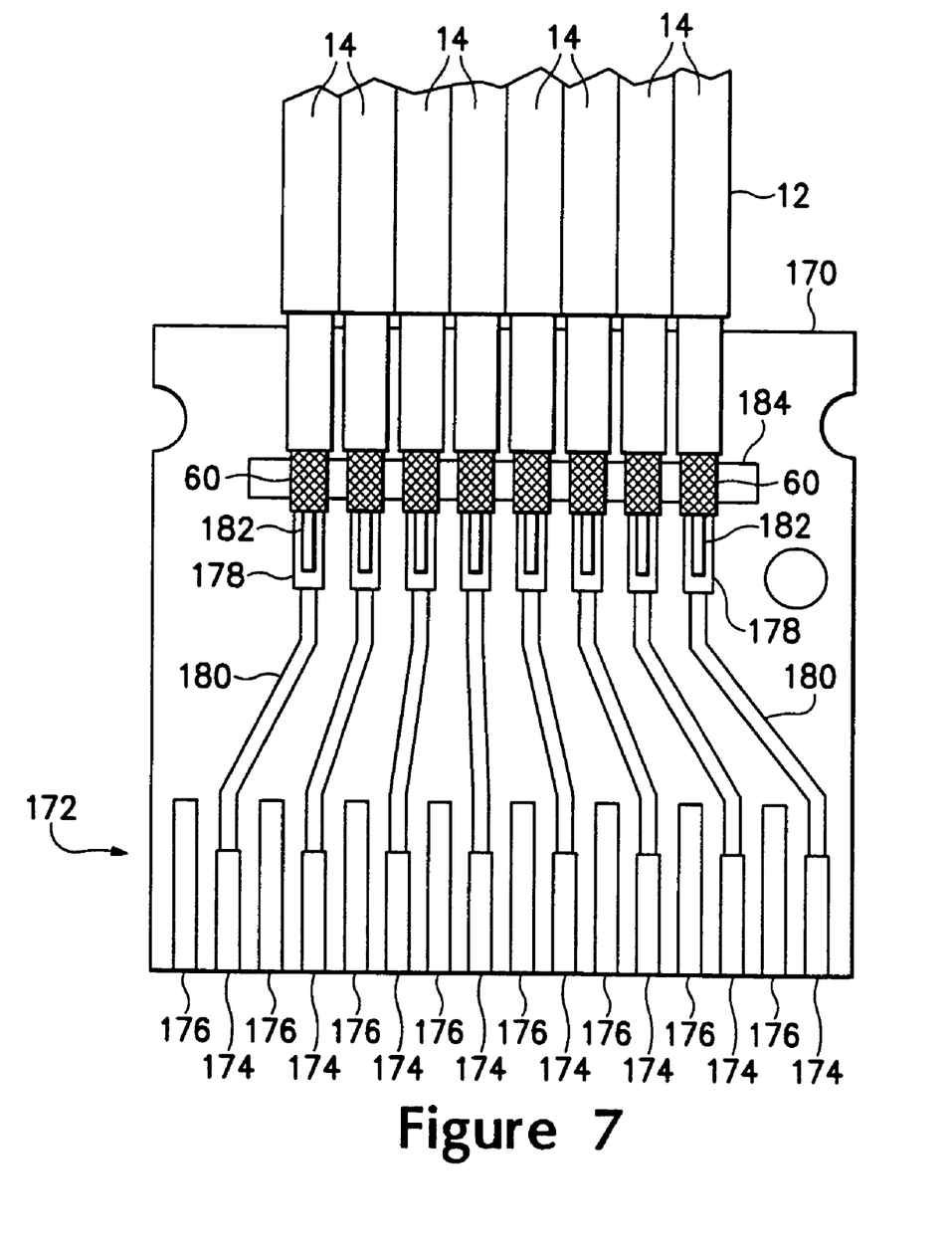
FIG. 7 is a plan view of the substrate in the terminal connector of the multi-channel signal acquisition probe.

A substrate 170 is disposed in the housing 140 and has edge located electrically conductive contacts 172 formed thereon as best shown in the plan view of the substrate in FIG. 7. The substrate 170 is preferably a multi-layer device formed of circuit board material, such as FR4. The electrically conductive contacts 172 are divided between signal contacts 174 and ground contacts 176. The signal contacts 174 are electrically coupled to signal conductor electrical contacts 178 via conductive traces 180 formed on the substrate 170. Central signal conductors 182 of the ganged coaxial signal cables 14 are electrically coupled to the signal contacts 178. The outer shielding conductors 60 of the coaxial signal cables 14 are electrically coupled to a common electrical contact 184. The common electrical contact 184 is electrically coupled to a ground plane disposed within the substrate 170 using vias formed through the substrate 170. The ground contacts 176 disposed on the edge of the substrate 170 are also electrically coupled to the ground plane using vias formed through the substrate 170.

The substrate 170 with the attached ribbon cable 12 is position in the housing member 142 with the ribbon cable 12 extending from an aperture 186 in the end of the housing member 142. The latch 146 is positioned within the housing member 142 with the prongs 152 extending from the apertures 158 and 160 on the opposing sides 162 and 164 of the housing member 142 and the knobs 154 extending from the apertures 166 and 168 in the opposing sides 162 and 164 of the housing member 142. The spring member 156 is positioned in the latch 146 along the inside of the arms 148 and base 150. The other housing member 144 is positioned on the first hosing member 142. Stud, apertures, ribs and slots 188 may be formed on periphery of the housing members 142, 144 to align the two housing members 142 144 together. The housing members 142 and 144 may be secured together using an adhesive, such as epoxy or the like, sonic welding, or other well known methods of securing two parts together.

Figure 8:
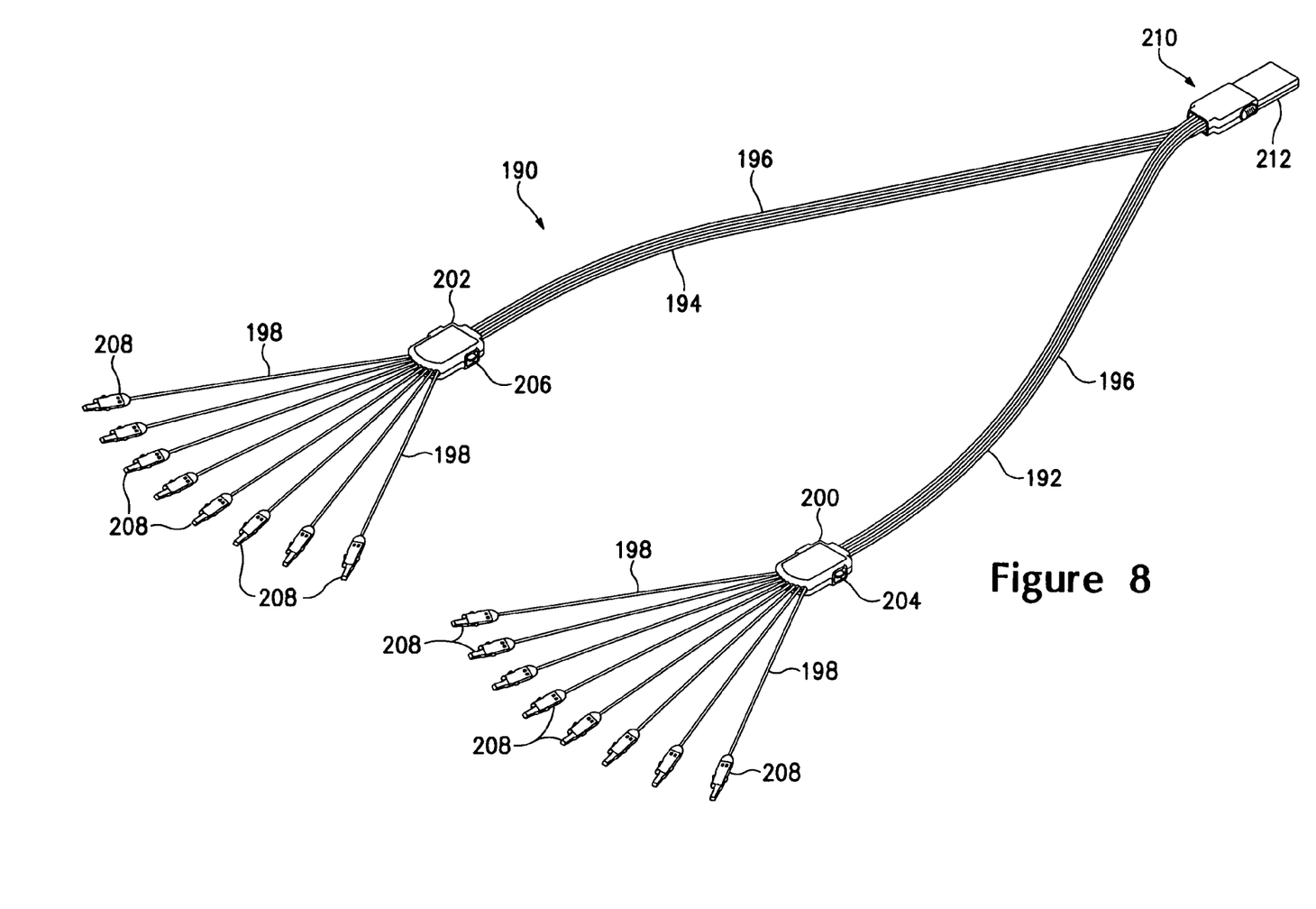
FIG. 8 is a further embodiment of the multi-channel signal acquisition probe.

FIG. 8 is a further embodiment of the multi-channel signal acquisition. The multi-channel signal acquisition probe 190 has multiple ribbon cables 192 and 194 with each ribbon cable 192 and 194 having coaxial signal cables 196 that are divided into individual coaxial signal cables 198. Each ribbon cable 192 and 194 has a junction box 200 and 202 positioned on the ribbon cables 192 and 194 where the coaxial signal cables 196 separate into individual coaxial signal cables 198. Each junction box 200 and 202 has an electrically conductive terminal 204 and 206 electrically coupled to the outer shielding conductors of the coaxial signal cables 196. The junction boxes 200 and 202 have the same structure and are constructed in the same manner as the previously described junction box 22. The free ends of each of the individual coaxial signal cables 198 has a probing head 208. The probing heads 208 have the same elements and are constructed in the same manner as the previously described probe heads 20. The ends of the ribbon cables 192 and 194 are terminated in a terminal connector 210. The housing 212 of the terminal connector 210 has the same components and is constructed in a similar manner to the previously terminals connector 140 with the exception of the substrate 170. The substrate 170 has signal and ground edge contacts 174 and 176, signal conductor electrical contacts 178, conductive traces 180 and common ground contact 184 on both sides of the substrate 170. The coaxial signal cables 196 of the ribbon cable 192 are electrically coupled to one side of the substrate 170 and the coaxial signal cables 196 of the ribbon cable 194 are electrically coupled to other side of the substrate 170. This implementation of the multi-channel signal acquisition probe 190 doubles the number of electrical signals that may be probed by the signal acquisition probe 190.

It will be obvious to those having skill in the art that many changes may be made to the details of the above-described embodiments of this invention without departing from the underlying principles thereof. The scope of the present invention should, therefore, be determined only by the following claims.

What is claimed is:

1. A multi-channel signal acquisition probe comprising:
   a ribbon cable having a plurality of coaxial signal cables with each coaxial signal cable having a central signal conductor and a surrounding shielding conductor separated by an insulating layer, the coaxial signal cables being separated into individual coaxial signal cable on one end of the ribbon cable;
   a junction box disposed on the ribbon cable where the coaxial signal cables separate into individual signal cables with the junction box having apertures disposed in a front face through which extend the individual coaxial signal cables, a rear aperture through which the ribbon cable extends, and openings on opposing sides of the junction box;
   an electrically conductive terminal disposed in the junction box and extending into the opposing openings of the junction box with the electrically conductive terminal electrically coupled to each of the outer shielding conductors of the coaxial signal cables;
   probing heads disposed on the free ends of each of the individual coaxial signal cables with each probing head having electrical circuitry electrically coupled to the central signal conductor and the outer shielding conductor of each coaxial signal cable; and
   a terminal connector disposed on the other end of the ribbon cable having electrically conductive contacts with each electrically conductive contact electrically coupled to one of the central signal conductors of the coaxial signal cables and at least one electrically conductive contact coupled to the surrounding shielding conductors of the coaxial signal cables.

2. The multi-channel signal acquisition probe as recited in claim 1 wherein the junction box has an arcuate front face and the apertures are evenly spaced on the arcuate front face.

3. The multi-channel signal acquisition probe as recited in claim 1 wherein the aperture in the junction box beveled outward.

4. The multi-channel signal acquisition probe as recited in claim 1 wherein the junction box further comprises first and second housing members with at least one of the first and second housing members has upwardly extending studs disposed adjacent to the opening on the opposing sides of the junction box.

5. The multi-channel signal acquisition probe as recited in claim 4 wherein the electrically conductive terminal is position in the junction box on the upwardly extending studs with the upwardly extending studs being received in apertures formed in the electrically conductive terminal.

6. The multi-channel signal acquisition probe as recited in claim 1 wherein the junction box further comprises first and second housing members with each of the first and second housing member having a stud disposed adjacent to one of the openings on the opposing sides of the junction box.

7. The multi-channel signal acquisition probe as recited in claim 6 wherein the electrically conductive terminal is position in the junction box such that the studs are received in apertures formed in the electrically conductive terminal.

8. The multi-channel signal acquisition probe as recited in claim 1 wherein each of the probing heads further comprises:
a substrate having the electrical circuitry disposed thereon;
a housing having a cavity formed therein with the cavity being exposed at one end of the housing for receiving the substrate and two bores formed in the other end of the housing intersecting the cavity, and an end cap positioned on the coaxial signal probe and disposed in cavity of the housing for securing the substrate in the cavity of the housing; and
electrically conductive contacts disposed in the bores in the housing electrically coupled to the electrical circuitry on the substrate.

9. The multi-channel signal acquisition probe as recited in claim 8 wherein the probing head housing has offset portions with one portion axially extending a greater distance than the other portion with one portion having one of the bores extending therein and the other portion having the other bore extending therein.

10. The multi-channel signal acquisition probe as recited in claim 9 wherein one end of the substrate has offset portions with one portion axially extending a greater distance than the other portion with each portion having an end face with an electrically conductive contact disposed thereon with the electrically conductive contact disposed on the end face of the substrate portion extending a greater distance electrically coupled to the central signal conductor of the coaxial signal probe via the electrical circuitry and the electrically conductive contact disposed on the end face of the other substrate portion electrically coupled to the outer shielding conductor of the coaxial signal cable.

11. The multi-channel signal acquisition probe as recited in claim 10 wherein each of the electrically conductive contacts further comprise a compressible electrically conductive contact electrically coupled to the electrically conductive contact on the end face of the substrate and an electrically conductive socket closely received in the respective bores and electrically coupled to the compressible electrically conductive contact.

12. The multi-channel signal acquisition probe as recited in claim 11 wherein the compressible electrically conductive contacts comprise electrically conductive elastomer.

13. The multi-channel signal acquisition probe as recited in claim 1 wherein the terminal connector further comprises a substrate having the electrically conductive contacts formed thereon and each of the central signal conductors and the outer shielding conductors of the coaxial signal probes electrically coupled to the substrate.

14. The multi-channel signal acquisition probe as recited in claim 13 wherein the terminal connector further comprises a housing receiving the substrate.

15. The multi-channel signal acquisition probe as recited in claim 14 wherein the terminal connector further comprises a spring latch disposed in the housing having movable latching prongs extending from either side of the housing.

16. A multi-channel signal acquisition probe comprising:
a plurality of ribbon cables with each of the plurality of ribbon cables having a plurality of coaxial signal cables with each coaxial signal cable having a central signal conductor and a surrounding shielding conductor separated by an insulating layer, the coaxial signal cables being separated into individual coaxial signal cable on one end of each of the plurality of ribbon cables;
a plurality of junction boxes with each junction box disposed on one of the plurality of ribbon cables where the plurality of coaxial signal cables separate into individual signal cables with each junction box having apertures disposed in a front face through which extend the individual coaxial signal cables of one of the plurality of ribbon cables, a rear aperture through which one of the plurality of ribbon cable extend, and each of the plurality of junction boxes having openings on opposing sides of each of the junction box;
a plurality of electrically conductive terminals with each electrically conductive terminal disposed in one of the plurality of junction boxes and extending into the opposing openings in the junction box with the electrically conductive terminal electrically coupled to each of the outer shielding conductors of the coaxial signal cables;
probing heads disposed on the free ends of each of the individual coaxial signal cables with each probing head having electrical circuitry electrically coupled to the central signal conductor and the outer shielding conductor of each coaxial signal cable; and
a terminal connector disposed on the other end of the plurality of ribbon cables having electrically conductive contacts with each electrically conductive contact electrically coupled to one of the central signal conductors of the coaxial signal cables and at least one electrically conductive contact coupled to the surrounding shielding conductors of the coaxial signal cables.

17. The multi-channel signal acquisition probe as recited in claim 16 wherein the junction box has an arcuate front face and the apertures are evenly spaced on the arcuate front face.

18. The multi-channel signal acquisition probe as recited in claim 16 wherein each of the probing heads further comprises:
a substrate having the electrical circuitry disposed thereon;
a housing having a cavity formed therein with the cavity being exposed at one end of the housing for receiving the substrate and two bores formed in the other end of the housing intersecting the cavity, and an end cap positioned on the coaxial signal probe and disposed in cavity of the housing for securing the substrate in the cavity of the housing; and
electrically conductive contacts disposed in the bores in the housing electrically coupled to the electrical circuitry on the substrate.

19. The multi-channel signal acquisition probe as recited in claim 16 wherein the junction box further comprises first and second housing members with at least one of the first and second housing members has upwardly extending studs disposed adjacent to the opening on the opposing sides of the junction box with the upwardly extending studs being received in apertures formed in the electrically conductive terminal.

20. The multi-channel signal acquisition probe as recited in claim 16 wherein the junction box further comprises first and second housing members with each of the first and second housing member having a stud disposed adjacent to one of the openings on the opposing sides of the junction box such that the studs are received in apertures formed in the electrically conductive terminal.

* * * * *